United States Patent
Lakdawala et al.

(10) Patent No.: US 8,098,726 B2
(45) Date of Patent: Jan. 17, 2012

(54) SUBRANGING FOR A PULSE POSITION AND PULSE WIDTH MODULATION BASED TRANSMITTER

(75) Inventors: Hasnain Lakdawala, Beaverton, OR (US); Ashoke Ravi, Hillsboro, OR (US); Ofir Degani, Haifa (IL); Itshak Hod, Haifa (IL); Yorgos Palaskas, Portland, OR (US); Masoud Sajadieh, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 790 days.

(21) Appl. No.: 12/176,646

(22) Filed: Jul. 21, 2008

(65) Prior Publication Data

US 2009/0034603 A1   Feb. 5, 2009

Related U.S. Application Data

(60) Provisional application No. 60/952,439, filed on Jul. 27, 2007.

(51) Int. Cl.
    *H03K 7/08*   (2006.01)
(52) U.S. Cl. ......................................... 375/238; 332/103
(58) Field of Classification Search .................. None
    See application file for complete search history.

(56) References Cited

U.S. PATENT DOCUMENTS 6,201,452 B1 *  3/2001  Dent et al. ..................... 332/103
2005/0239455 A1 * 10/2005  Stephens ..................... 455/426.2

FOREIGN PATENT DOCUMENTS

WO   WO-2007083281 A1 *  7/2007

* cited by examiner

*Primary Examiner* — David C. Payne
*Assistant Examiner* — Leon-Viet Nguyen
(74) *Attorney, Agent, or Firm* — Cool Patent, P.C.; Kenneth J. Cool; Joseph P. Curtain

(57) ABSTRACT

Briefly, in accordance with one or more embodiments, in a pulse position and pulse position modulation out-phasing transmitter, the range of the phase angle, theta, may be divided into more than one range to drive a first power amplifier with a first range of theta, and to drive a second power amplifier with a second range of theta. In one or more embodiments, a main power amplifier is driven with a first phase range having a higher probability density function, and an overload power amplifier is driven with a first phase range having a lower probability density function. In one or more embodiments, a full adder may be used to combine the two phases wherein the sum signal is used to drive the main power amplifier, and the carry signal is used to drive the overload power amplifier.

27 Claims, 9 Drawing Sheets

SUBRANGING FOR A PULSE POSITION AND PULSE WIDTH MODULATION BASED TRANSMITTER

CROSS-REFERENCE TO RELATED APPLICATIONS

The present application claims the benefit of U.S. Provisional Application No. 60/952,439 filed Jul. 27, 2007. Said Application No. 60/952,439 is hereby incorporated herein by reference in its entirety.

BACKGROUND

Orthogonal frequency division multiplexing (OFDM) has become the modulation of choice for higher data-rate wireless communication links for personal area networks (PAN), local area networks (LAN) and metropolitan area networks (MAN) networks. OFDM waveforms have both amplitude and phase information requiring linear amplifiers generally having lower efficiency in the transmitter power amplifier (PA). The significant peak-to-average power ratios, typically 10 dB to 15 dB, further reduces the average efficiency of such OFDM transmitters. Power control on mobile units may further result in an average transmit power that is typically 30 dB to 50 dB lower than the peak power, and a corresponding reduction in efficiency. In mobile and handheld applications, such lower power efficiency in transmit mode may severely affect reliability, for example, due to thermal issues, as well as limiting battery life of the hand held device. Switching power amplifiers, commonly utilized with pure frequency/phase modulation schemes, are capable of achieving a higher efficiency; however, the application of switching power amplifiers to OFDM systems is not straightforward.

Furthermore, conventional radio transmitters comprise analog circuits which are sensitive to process, voltage and/or temperature, typically utilize inductors that occupy a larger die area, and/or that are not compatible with scaled lower-voltage complementary metal-oxide semiconductor (CMOS) processes, such as headroom/linearity, gain and/or matching constraints. The increasing speed of the lower-voltage transistor can be exploited to replace lower-speed, higher-resolution analog circuits with higher-speed, lower-resolution circuits.

DESCRIPTION OF THE DRAWING FIGURES

Claimed subject matter is particularly pointed out and distinctly claimed in the concluding portion of the specification. Such subject matter, however, may be understood by reference to the following detailed description when read with the accompanying drawings in which:

Figure 5:
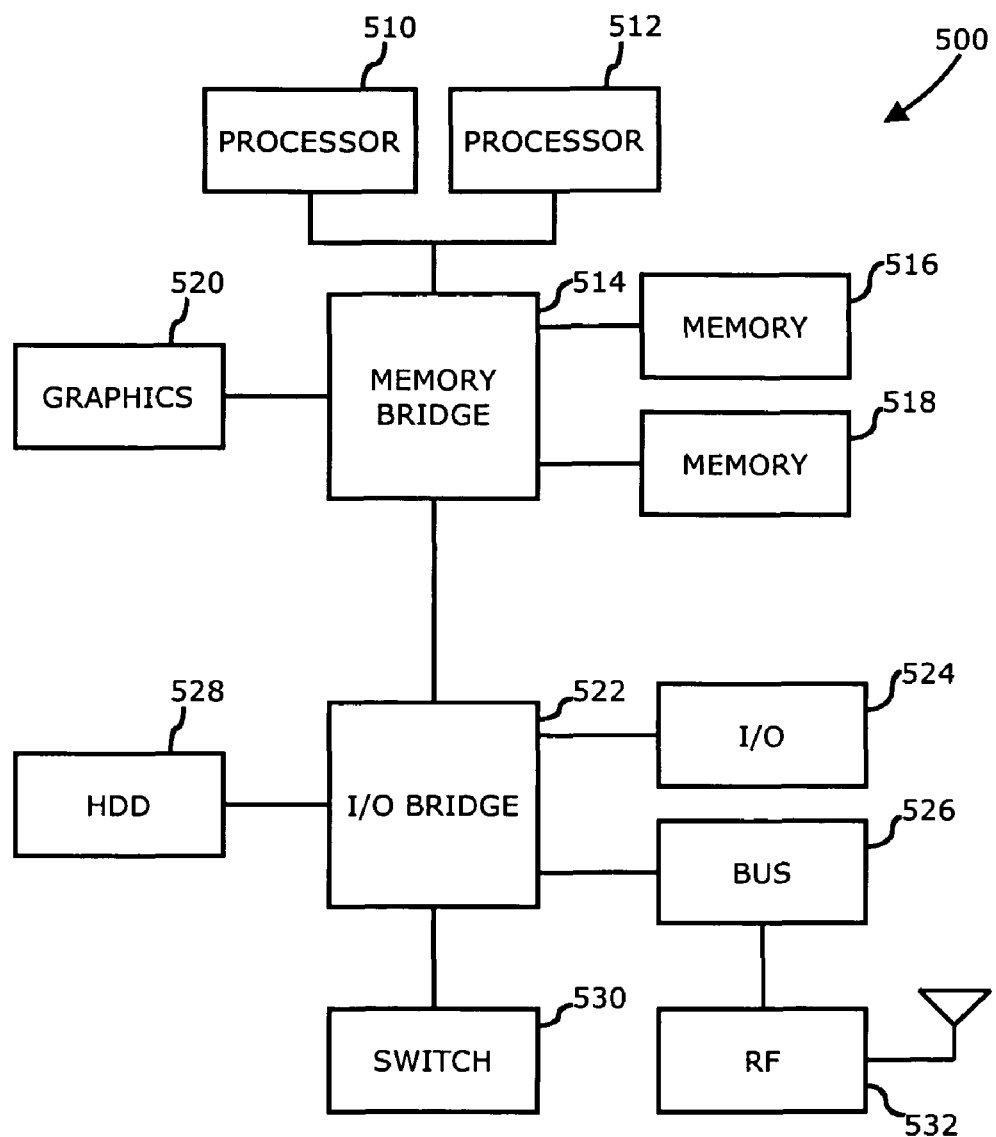
Figure 6:
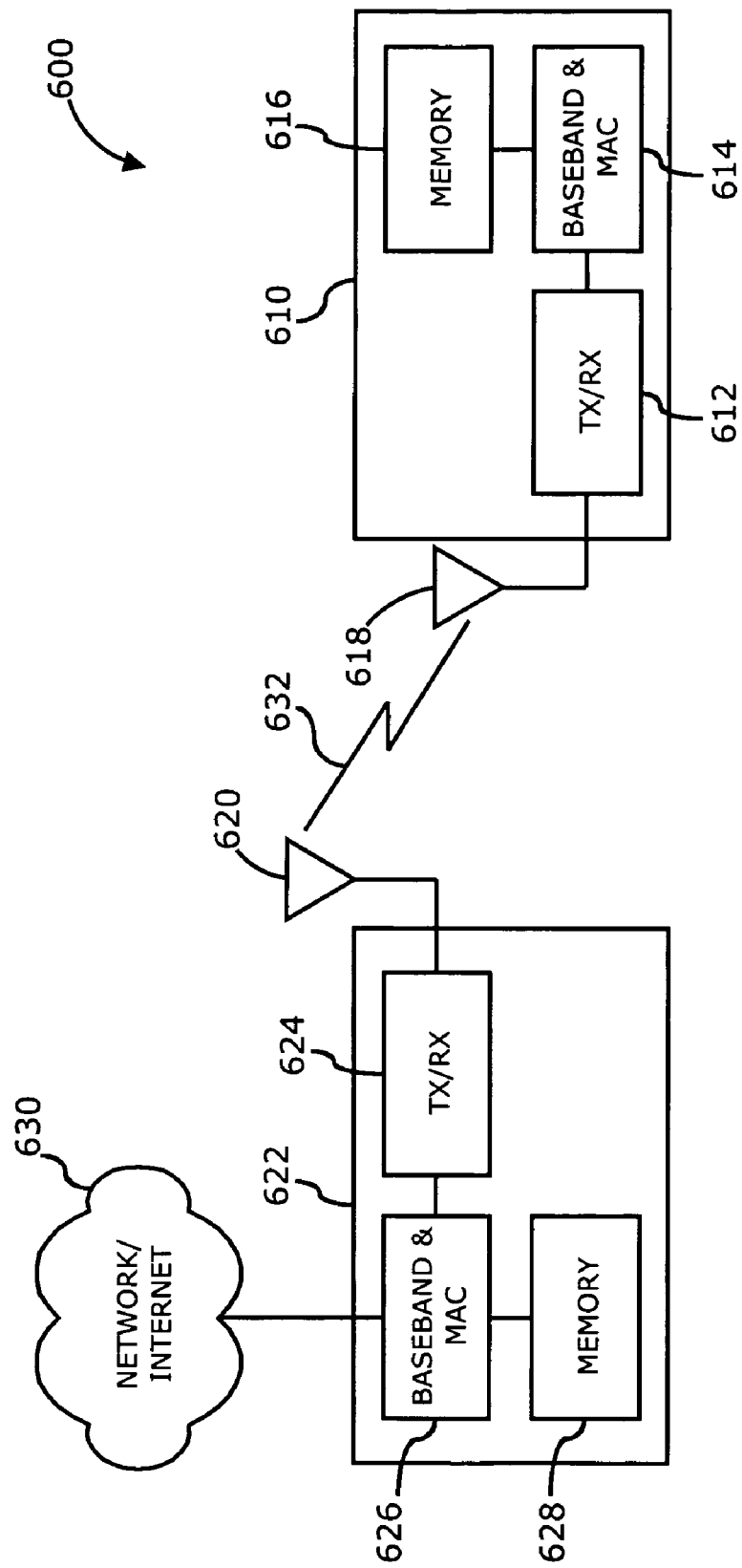
Figure 7:
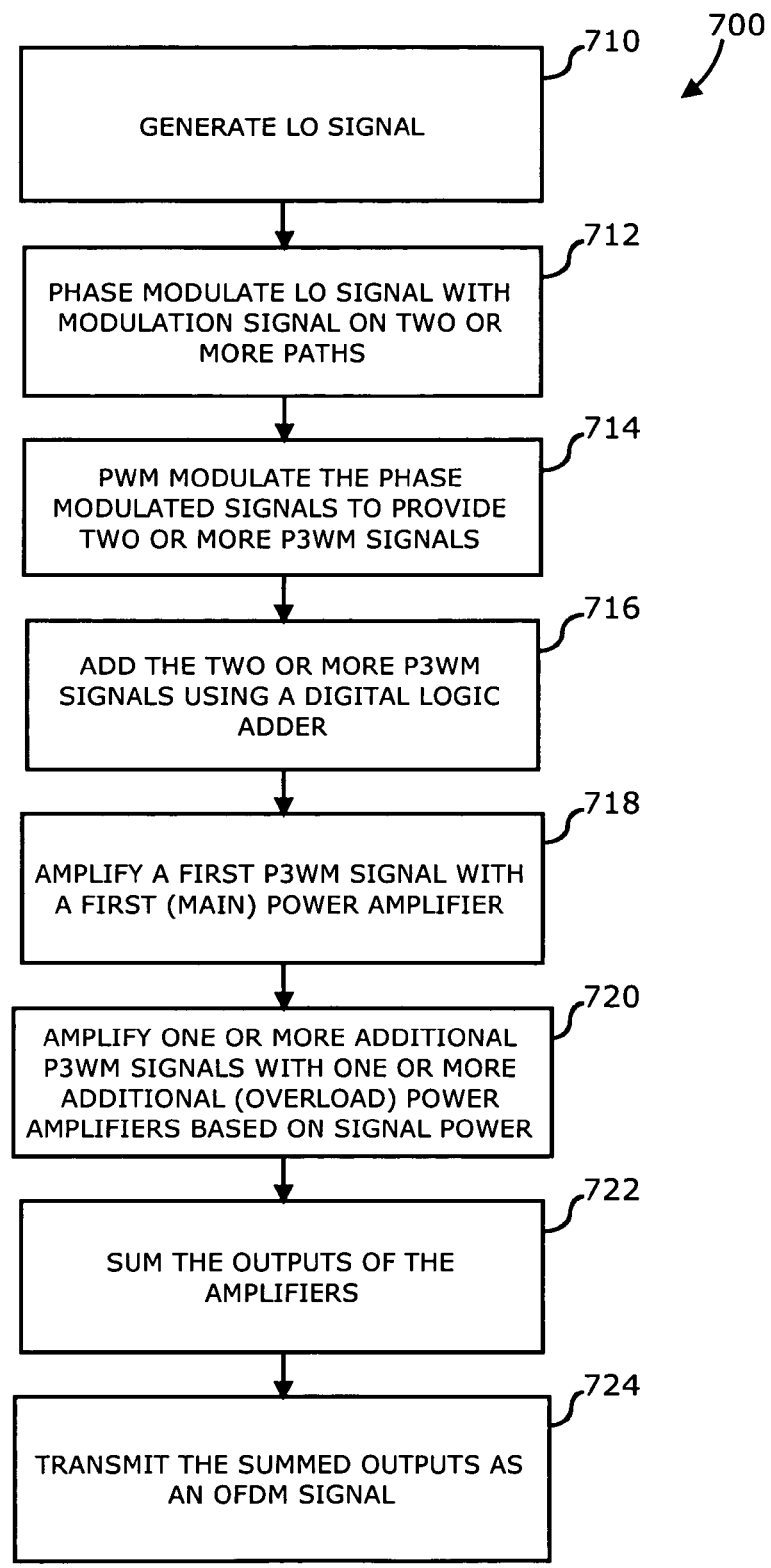
Figure 8:
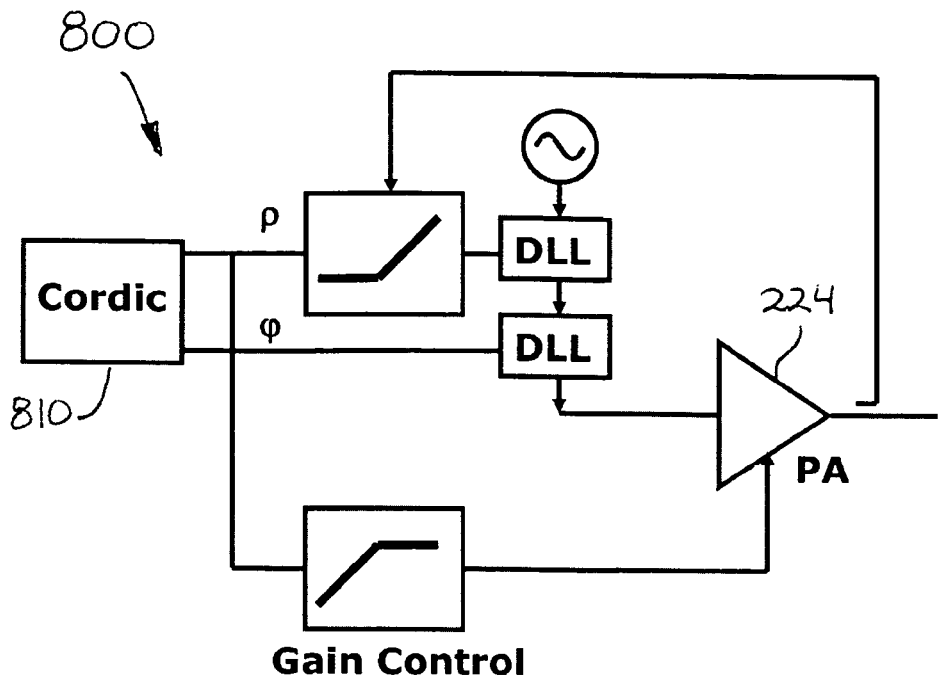
Figure 9:
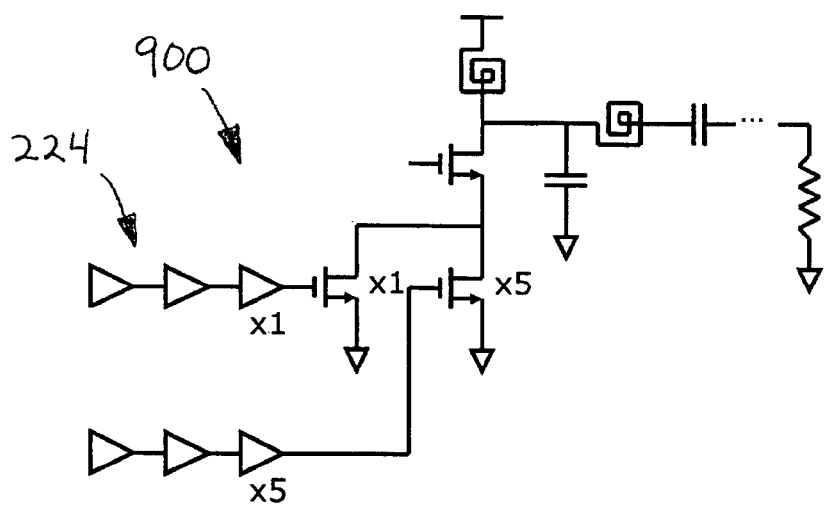
Figure 10:
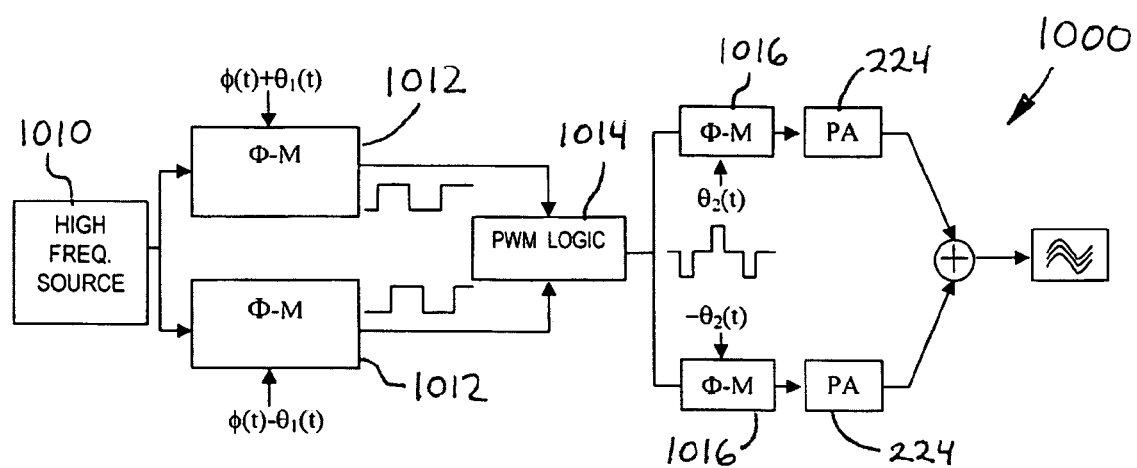

FIG. 5 is a block diagram of an information-handling system capable of utilizing a digital integrated transmitter using subranging for pulse-position and pulse-width modulation in accordance with one or more embodiments; and FIG. 6 is a block diagram of a wireless local area or cellular network communication system showing one or more network devices capable of utilizing a digital integrated transmitter using subranging for pulse-position and pulse-width modulation in accordance with one or more embodiments;

FIG. 7 is a flow diagram of a method for using subranging for a pulse-position and pulse-width modulation based transmitter in accordance with one or more embodiments;

FIG. 8 is a diagram of a transmitter implementing a pulse-width-position envelope-elimination-and-restoration (PWPM-EER) scheme in accordance with one or more embodiments;

FIG. 9 is a diagram of a transmitter implementing an alternative embodiment of a pulse-width-position position envelope-elimination-and-restoration (PWPM-EER) scheme in accordance with one or more embodiments; and FIG. 10 is a diagram of a transmitter implementing a pulse-width-position outphasing (PWPM-outphasing) scheme with outphasing in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. It will, however, be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. Coupled, however, may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. "Over," however may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise"

and "include," along with their derivatives, may be used and are intended as synonyms for each other.

Figure 1:
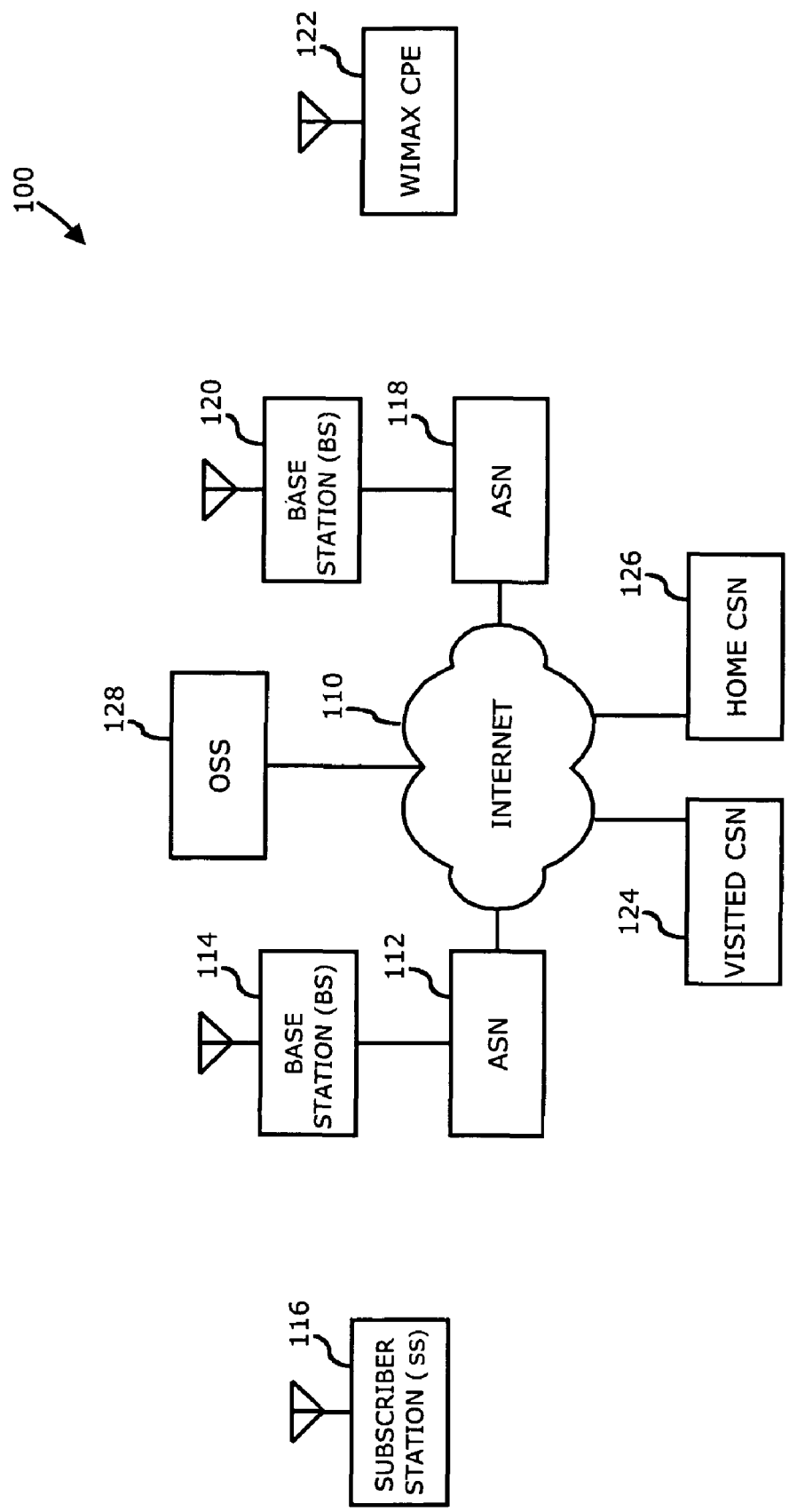
FIG. 1 is a block diagram of a wireless network capable of utilizing a digital integrated transmitter using subranging for pulse-position and pulse-width modulation in accordance with one or more embodiments.

Referring now to FIG. 1, a block diagram of a wireless network capable of utilizing a digital integrated transmitter using subranging for pulse-position and pulse-width modulation in accordance with one or more embodiments will be discussed. In one or more embodiments, any one or more of base station 114, subscriber station 116, base station 122, and/or WiMAX customer premises equipment (CPE) 122 may utilize the transmitter 200 of FIG. 2, transmitter 300 of FIG. 3, or transmitter 400 of FIG. 4, below, comprising a digital integrated transmitter using subranging for pulse-position and pulse-width modulation, although the scope of the claimed subject matter is not limited in this respect. As shown in FIG. 1, network 100 may be an Internet Protocol (IP) type network comprising an Internet 110 type network or the like that is capable of supporting mobile wireless access and/or fixed wireless access to Internet 110. In one or more embodiments, network 100 may be in compliance with a Worldwide Interoperability for Microwave Access (WiMAX) standard or future generations of WiMAX, and in one particular embodiment may be in compliance with an Institute for Electrical and Electronics Engineers 802.16e standard (IEEE 802.16e). In one or more alternative embodiments network 100 may be in compliance with a Third Generation Partnership Project Long Term Evolution (3GPP LTE) or a 3GPP2 Air Interface Evolution (3GPP2 AIE) standard. In general, network 100 may comprise any type of orthogonal frequency division multiple access (OFDMA) based wireless network, although the scope of the claimed subject matter is not limited in these respects. As an example of mobile wireless access, access service network (ASN) 112 is capable of coupling with base station (BS) 114 to provide wireless communication between subscriber station (SS) 116 and Internet 110. Subscriber station 116 may comprise a mobile-type device or information-handling system capable of wirelessly communicating via network 100, for example, a notebook-type computer, a cellular telephone, a personal digital assistant, or the like. ASN 112 may implement profiles that are capable of defining the mapping of network functions to one or more physical entities on network 100. Base station 114 may comprise radio equipment to provide radio-frequency (RF) communication with subscriber station 116, and may comprise, for example, the physical layer (PHY) and media access control (MAC) layer equipment in compliance with an IEEE 802.16e type standard. Base station 114 may further comprise an IP backplane to couple to Internet 110 via ASN 112, although the scope of the claimed subject matter is not limited in these respects.

Figure 2:
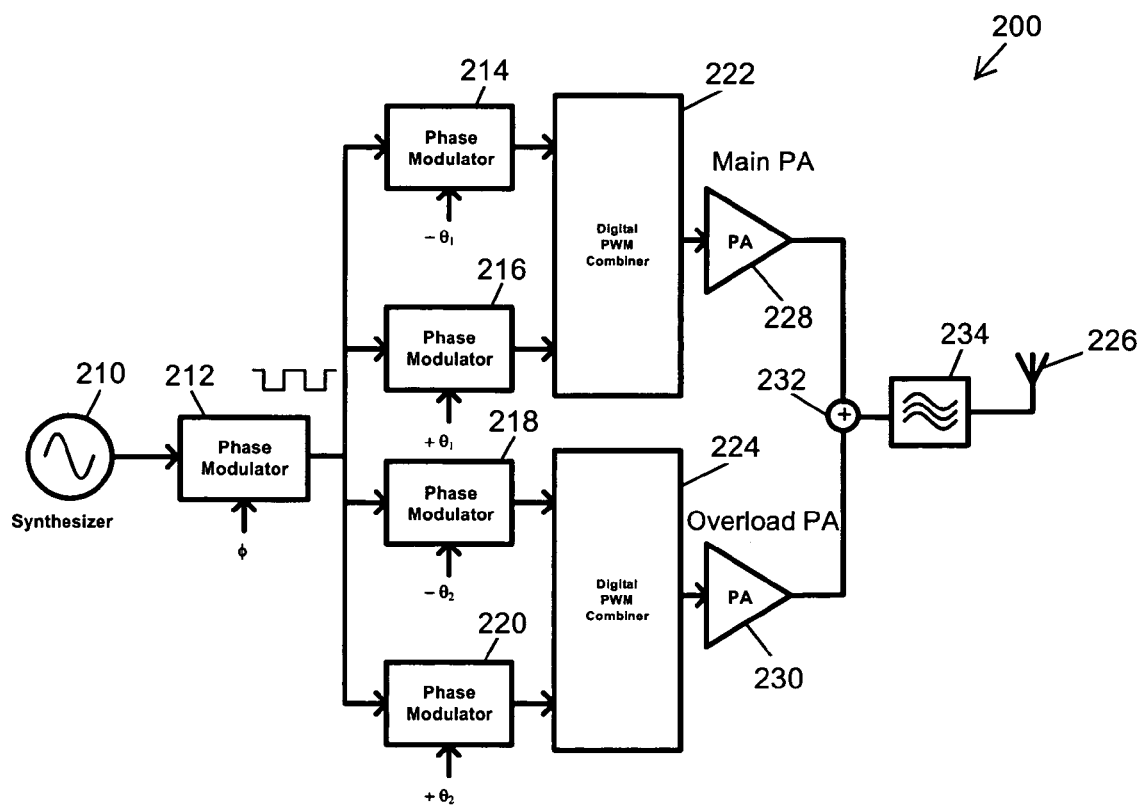
FIG. 2 is a block diagram of transmitter utilizing subranging for two-path pulse-position and pulse-width modulation out-phasing in accordance with one or more embodiments.
Figure 3:
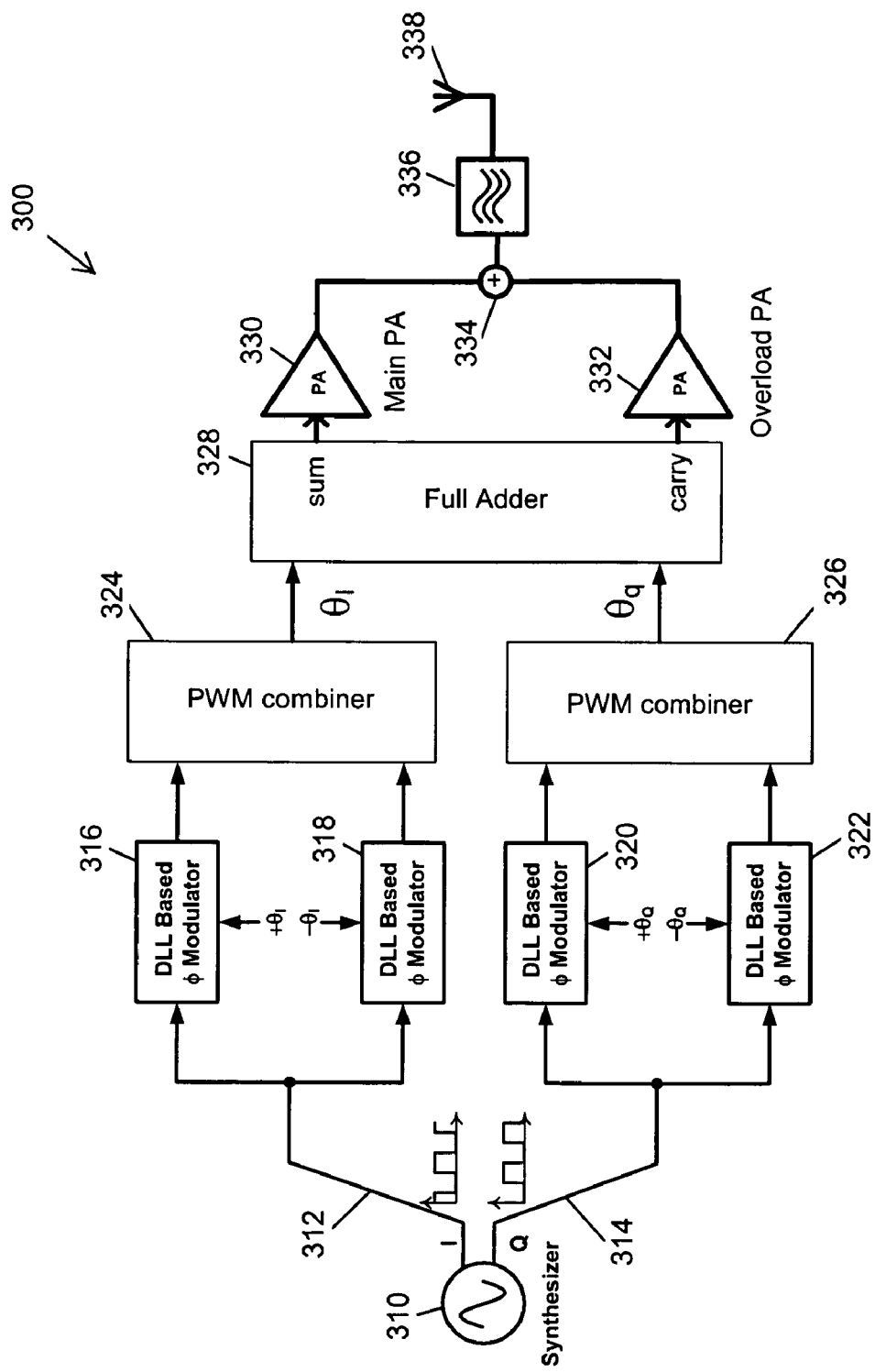
FIG. 3 is a block diagram of a transmitter utilizing time-domain phase separation applied to four-path pulse-position and pulse-width modulation in accordance with one or more embodiments.

Network 100 may further comprise a visited connectivity service network (CSN) 124 capable of providing one or more network functions including, but not limited to proxy- and/or relay-type functions, for example, authentication, authorization and accounting (AAA) functions, dynamic host configuration protocol (DHCP) functions, or domain-name service controls or the like, domain gateways, such as public switched telephone network (PSTN) gateways or Voice Over Internet Protocol (VOIP) gateways, and/or Internet Protocol (IP) type server functions, or the like. These are, however, merely example of the types of functions that are capable of being provided by visited CSN or home CSN 126, and the scope of the claimed subject matter is not limited in these respects. Visited CSN 124 may be referred to as a visited CSN in the case for example in which visited CSN 124 is not part of the regular service provider of subscriber station 116, for example, where subscriber station 116 is roaming away from its home CSN, such as home CSN 126, or for example, in which network 100 is part of the regular service provider of subscriber station, but in which network 100 may be in another location or state that is not the main or home location of subscriber station 116. In a fixed wireless arrangement, WiMAX-type customer premises equipment (CPE) 122 may be located in a home or business to provide home or business customer broadband access to Internet 110 via base station 120, ASN 118, and home CSN 126 in a manner similar to access by subscriber station 116 via base station 114, ASN 112, and visited CSN 124, a difference being that WiMAX CPE 122 is generally disposed in a stationary location, although it may be moved to different locations as needed, whereas subscriber station may be utilized at one or more locations if subscriber station 116 is within range of base station 114 for example. In accordance with one or more embodiments, operation support system (OSS) 128 may be part of network 100 to provide management functions for network 100 and to provide interfaces between functional entities of network 100. Network 100 of FIG. 1 is merely one type of wireless network showing a certain number of the components of network 100 that are capable of utilizing a digital integrated transmitter using subranging for pulse-position and pulse-width modulation as shown in FIG. 2, FIG. 3, and/or FIG. 4, below, and the scope of the claimed subject matter is not limited in these respects.

Although network 100 as shown in FIG. 1 is a WiMAX network as an example, it should be noted that transmitter 200 of FIG. 2, transmitter 300 of FIG. 3, and/or transmitter 400 of FIG. 4, below may be utilized in other types of wireless networks and/or applications utilizing wideband orthogonal frequency division multiplexing (OFDM) modulation. For example, in one or more embodiments, network 100 alternately may comprise a network in compliance with an Institute of Electrical and Electronics Engineers (IEEE) standard such as an IEEE 802.11a/b/g/n standard, an IEEE 802.16 d/e standard, an IEEE 802.20 standard, an IEEE 802.15 standard, an Ultra-Wide Band (UWB) standard, a Third Generation Partnership Project Long Term Evolution (3GPP-LTE) standard, an Enhanced Data Rates for Global System for Mobile Communications (GSM) Evolution (EDGE) standard, a Wideband Code Division Multiple Access (WCDMA) standard, a Digital Video Broadcasting (DVB) standard, or the like, and the scope of the claimed subject matter is not limited in this respect. Furthermore, although examples herein are directed to OFDM modulation, the scope of the claimed subject matter may apply to any type of modulation, including, but not limited to, continuous wave (CW) modulation, amplitude-shift keying (ASK) modulation, phase-shift keying (PSK) modulation, frequency-shift keying (FSK) modulation, quadrature amplitude modulation (QAM), continuous phase modulation (CPM), trellis code modulation (TCM), and so on.

In one or more embodiments, the concept of pulse-width and pulse-position modulation (P3WM) and outphasing is discussed with respect to FIGS. 2 to 4, 8 and 10 in general. The desired radio-frequency (RF) signal comprising in-phase I(t) and quadrature Q(t) components is mapped into two constant-amplitude, but phase-modulated signals $s_1(t)$ and $s_2(t)$ according to the equations shown below:

Desired RF signal: $y_o(t) = I(t) \cdot \cos(\omega t) + Q(t) \cdot \sin(\omega t)$ Reconstructed RF signal: $y_o(t) = s_1(t) + s_2(t)$ in which the two-component phase-modulated signals are given by constant-amplitude phase-modulation components:

$s_1(t) = A \cdot \cos(\omega t + \phi + \theta)$ $s_2(t) = A \cdot \cos(\omega t + \phi - \theta)$ With standard trigonometric manipulation, it can be shown that:

$$\theta(t) = \cos^{-1}\left(\sqrt{\frac{I^2(t) + Q^2(t)}{2A}}\right)$$

$$\phi(t) = \tan^{-1}\left(\frac{Q(t)}{I(t)}\right)$$

In P³WM arrangements, the combining of signals $s_1(t)$ and $s_2(t)$ is done before the power amplifier 224 using differential logic and a single combined stream to drive one or more switching power amplifiers, as shown for example in FIGS. 2 to 4, 8 and 10. Such P³WM arrangements differ from a class-D amplifier in that with a class-D amplifier the signal driving the power amplifier is constructed by a $\Delta$ or $\Delta\Sigma$ modulator. In such a class-D case, the carrier signal is constructed by an over-sampled, higher frequency, pulse-width modulation (PWM) signal, in which the number of transitions set the power to transmit.

Such decomposition enables the utilization of switching power amplifiers 224 for achieving higher efficiency across a wider power variation while maintaining sufficient modulation quality suitable for wideband modulation signals exhibiting significant envelope variation, although the scope of the claimed subject matter is not limited in this respect.

Typical out-phasing modulators have a distribution of theta that is a Raleigh distribution. A typical switching power amplifier exhibits a highest efficiency when the duty cycle of the PWM input is high as the portion of harmonic content is lower. This means that a conventional PWM switching PA operates in an area of lower efficiency most of the time, degrading the temporal efficiency. Theoretical efficiency curves show that the efficiency at 10 dB back-off, typical for common OFDM-based standards, degrades to only about 40% from 80-90% at peak powers. The typical power dynamic range to support complex modulations with good error vector magnitude (EVM) and adjacent channel power ratio (ACPR) is typically in the range 35-40 dB. Furthermore, the switching PA must support a power-control dynamic range. The worse case efficiency can be as bad as 10% or less over a significant portion of the power dynamic range. Such degradation can be reduced through the use of higher odd and even harmonic terminations. In practice, the device parasitics and die area considerations limit the number of harmonic terminations that can be used. Also, real circuits have finite delays and rise/fall times which limits the minimum synthesizable pulse width at gigahertz (GHz) frequencies. This in turn translates to a minimum deliverable power and limits the achievable power dynamic range.

Referring now to FIG. 2, a block diagram of transmitter utilizing subranging for two-path pulse-position and pulse-width modulation out-phasing in accordance with one or more embodiments will be discussed. A typical out-phasing modulator has a distribution of theta $\theta$ that is a Raleigh distribution such as for a typical OFDM modulated signal used in an IEEE 802.11a/g standard. A typical switching power amplifier has higher efficiency when the duty cycle of the input to the pulse-width modulator is higher valued since the portion of harmonic content is lower. As a result, a conventional pulse-width modulation (PWM) switching power amplifier (PA) operates in an area of lower efficiency most of the time, thereby degrading the temporal efficiency. Transmitter 200 of FIG. 2 overcomes this issue by having multiple power amplifiers, for example, main PA 228 and overload PA 230, that are driven. The signals for the two power amplifiers are generated via phase mapping as discussed, below.

As shown in FIG. 2, transmitter 200 includes synthesizer 210 to generate a higher frequency local-oscillator (LO) signal that is provided to phase modulator 212. Phase modulator 212 phase modulates the LO signal using $\phi$ as a control signal to provide a first modulated output that is split into four paths and provided to four phase modulators 214, 216, 218, and 220. Phase modulator 214 receives $-\theta_1$ as a control signal, phase modulator 216 receives $+\theta_1$ as a control signal, phase modulator 216 receives $-\theta_2$ as a control signal, and phase modulator 220 receives $+\theta_2$ as a control signal. The phase-modulated outputs of phase modulator 214 and phase modulator 216 are provided to a first digital pulse-width modulation (PWM) combiner 222, and the phase-modulated outputs of phase modulator 218 and phase modulator 220 are provided to a second digital pulse-width modulation (PWM) combiner 224. The output of the first PWM combiner 222 is a position and pulse-width modulated output that is provided to main PA 228, and the output of second PWM combiner 224 is a pulse-position and pulse-width modulated output that is provided to overload PA 230. The outputs of main PA 228 and overload PA are combined via summing element 232 which is coupled to impedance matching network 234 and antenna 226 for transmission as an OFDM signal.

The architecture of transmitter 200 of FIG. 2 illustrates a sub-ranging technique applied to a conventional two-path pulse-position and pulse-width modulation (P3WM) out-phasing power amplifier scheme in which $\phi$ and $\theta$ are modulated directly. The entire range, or nearly the entire range, of $\theta$ is divided in to more than one section such that each power amplifier 228 and 230 is driven by separately modulated signals with phases $\theta_1$ and $\theta_2$. In one or more embodiments, the baseband data signals are decomposed for the two power amplifier embodiment shown in FIG. 2 in the following manner. The baseband data signal is represented as:

$$y_o(t) = \frac{A}{2}\cos(\omega t + \phi(t) - \theta_1(t)) + \frac{A}{2}\cos(\omega t + \phi(t) + \theta_1(t)) +$$
$$\frac{A}{2}\cos(\omega t + \phi(t) - \theta_2(t)) + \frac{A}{2}\cos(\omega t + \phi(t) + \theta_2(t))$$
$$y_o(t) = A\cos(\theta_1(t))\cos(\omega t + \phi(t)) + A\cos(\theta_2(t))\cos(\omega t + \phi(t))$$

In one or more embodiments, the decomposition algorithm should satisfy the following equation:

$$2\cos(\theta(t)) = \cos(\theta_1(t)) + \cos(\theta_2(t))$$

in which, $\theta$ is the phase of an out-phasing scheme. By utilizing a proper choice of $\theta_1$ and $\theta_2$, main PA 228 is on most or all of the time and overload PA 230 is used only occasionally to service any needed peak power. Such an arrangement as shown in FIG. 2 does not require, for example, radio frequency (RF) phase shifters. In one or more embodiments, one possible mapping of $\theta$ to $\theta_1$ and $\theta_2$ for a two power amplifier arrangement as shown in FIG. 2 may be as follows:

---

For $\theta < 60°$, $\theta_2 = 90°$:
    $\theta_1$ ranges from 90° to 0°
        $\cos(\theta_1(t)) = 2\cos(\theta(t))$
For $60° < \theta < 90°$:
    $\theta_1 = 0°$ and $\theta_2$ is
        $\cos(\theta_2(t)) = 2\cos(\theta(t)) - 1$ The current or the power at the outputs of the two separately driven power amplifiers, main PA 228 and overload PA 230, is summed at the output via a power combining technique that may include, but is not limited to current summing and RF power combining using passive elements, although the scope of the claimed subject matter is not limited in this respect. The mapping of θ to $θ_1$ and $θ_2$, can be implemented using any one or more of the following techniques: modification of the coordinated rotation digital computer (CORDIC) algorithm to generate $θ_1$ and $θ_2$, directly; generation of mapping of θ to $θ_1$ and $θ_2$ via utilization of a look up table; and/or generation of θ to $θ_1$ and $θ_2$ using a feedback signal to avoid distortion during the overlap of the modulation angles, although the scope of the claimed subject matter is not limited in these respects. Although transmitter 200 of FIG. 2 illustrates a two power amplifier example, transmitter 200 may be expanded any number of power amplifiers with different $P^3WM$ driven power amplifiers used for different segments of the dynamic range, and the scope of the claimed subject matter is not limited in this respect.

Referring now to FIG. 3, a block diagram of a transmitter utilizing time-domain phase separation applied to four-path pulse-position and pulse-width modulation in accordance with one or more embodiments will be discussed. Transmitter 300 of FIG. 3 embodies a modified version of transmitter 200 of FIG. 2 that can be applied to a four-path pulse-width modulation scheme. As shown in FIG. 3, synthesizer 310 generates quadrature local-oscillator (LO) signals to provide in-phase (I) signal on a first path 312 and a quadrature signal (Q) on a second path 314 wherein the $θ_I$ and the $θ_Q$ paths are both modulated separated into four total paths for phase modulation via four phase modulators 316, 318, 320, and 322. Phase modulators 316, 318, 320, and 322 modulate the I and Q local-oscillator signals via control signals $+θ_I$, $-θ_I$, $+θ_Q$, $-θ_Q$, respectively. The outputs of phase modulators 316 and 318 are combined via a first PWM combiner 324, and the outputs of phase modulators 320 and 322 are combined via a second PWM combiner 326. The outputs of PWM combiners 324 and 326 are combined via full adder 328 to drive main PA 330 with pulse-position and pulse-width modulated ($P^3WM$) signal. The phase separation illustrated, above, may be implemented via digital logic in full adder 328 that detects the overload power of the signal via the carry bit generated in the summation of the signals from PWM combiner 324 and PWM combiner 326. The sum output from full adder 328 may be utilized to drive main PA 330 and the carry bit output from full adder 328 may be utilized to drive overload PA 332. In such an arrangement, overload PA 332 will operate only during an overlap portion of the pulse-width modulated (PWM) I and Q signals when additional power may be needed, although the scope of the claimed subject matter is not limited in this respect. The outputs of main PA 330 and overload PA 332 may be combined via summing element 334 to transmit an OFDM signal via impedance matching network 336 and antenna 338.

Figure 4:
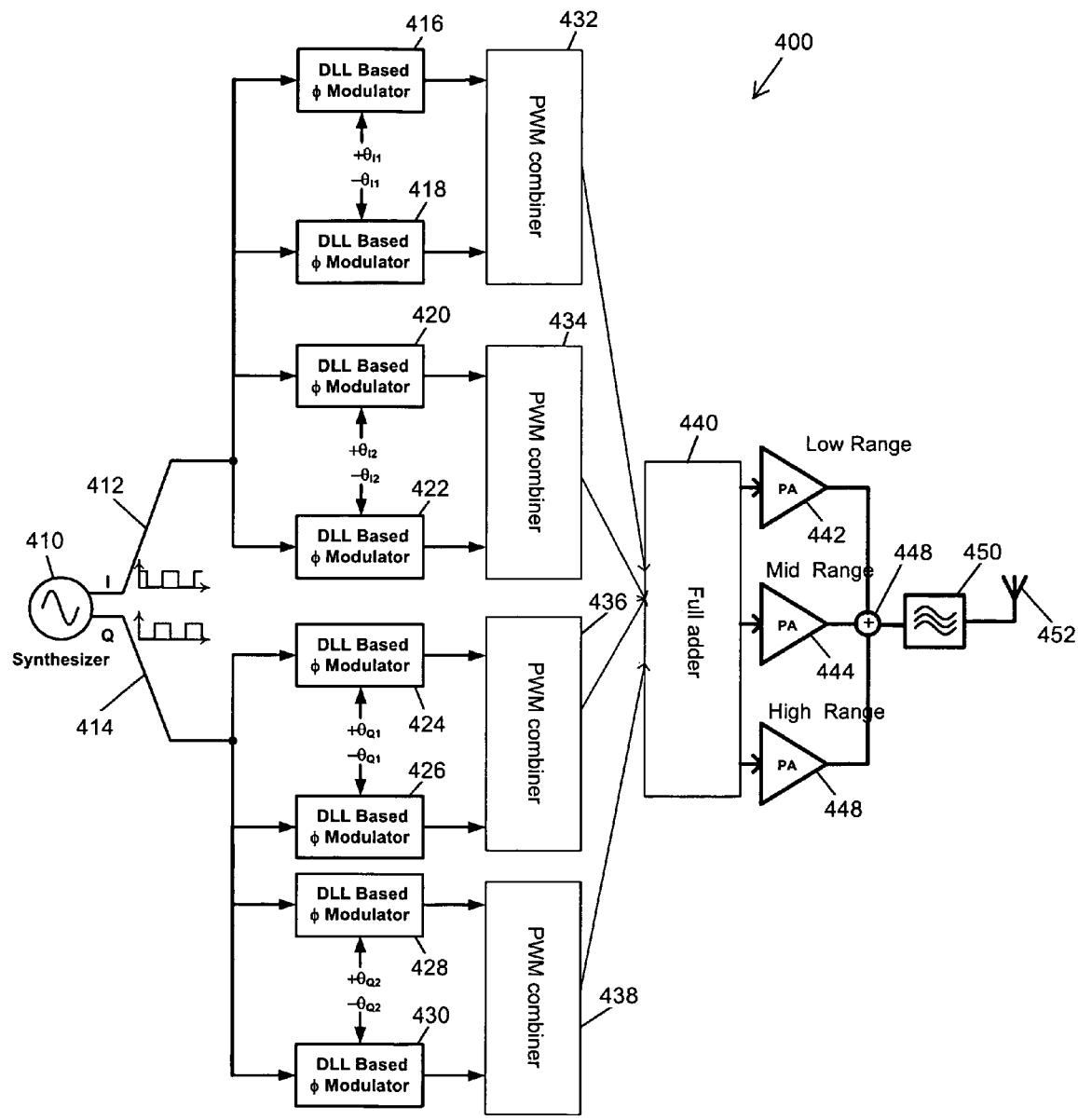
FIG. 4 is a block diagram of a transmitter utilizing a combination of time-domain and phase-domain separation in accordance with one or more embodiments.

Referring now to FIG. 4, a block diagram of a transmitter utilizing a combination of I/Q and θ separation in accordance with one or more embodiments will be discussed. As shown in FIG. 4, both time-domain and phase-domain phase separation may be combined to generate multilevel signals as desired. Transmitter 400 of FIG. 4 is substantially similar to transmitter 300 of FIG. 3, except that the in-phase (I) and quadrature (Q) local-oscillator signals generated by synthesizer 410 are each separated into four paths each having four phase modulators to implement four-path phase modulation of the I local-oscillator signal and of the Q local-oscillator signal, respectively. Phase modulators 416, 418, 420, and 422 for the I signal path receive control signals $+θ_{I1}$, $-θ_{I1}$, $+θ_{I2}$, and $-θ_{I2}$, respectively. Phase modulators 424, 426, 428, and 430 for the Q signal path receive control signals $+θ_{Q1}$, $-θ_{Q1}$, $+θ_{Q2}$, and $-θ_{Q2}$, respectively. The outputs of phase modulators 416 and 418 are combined via PWM combiner 432, and the output of phase modulators 420 and 422 are combined via PWM combiner 434. Likewise, the outputs of phase modulators 424 and 426 are combined via PWM combiner 436, and the outputs of phase modulators 428 and 430 are combined via PWM combiner 438. The outputs of PWM combiners 432, 434, 436, and 438 are then combined via full adder 440 to drive multiple power amplifiers which as shown in FIG. 3 may comprise low-range PA 442, mid-range PA 444, and high-range PA 446. The outputs of power amplifiers 442, 444, and 446 are combined via summing element 448 to transmit an OFDM signal via impedance matching network 450 and antenna 452, although the scope of the claimed subject matter is not limited in this respect. By using a three-power-amplifier arrangement as shown in FIG. 4, full adder 440 may provide three outputs based at least in part on the power of the pulse-position and pulse-width modulated signal to be transmitted. Low-range PA 442 may be the only power amplifier operating when the power of the signal to be transmitted is in a lower range. When the power of the signal to be transmitted is in a mid range, mid-range PA 448 powers on in addition to low-range PA 442. When the power of the signal to be transmitted is in a higher range, for example at or near peak power, high-range PA 446 also powers on so that all three power amplifiers, low-range PA 442, mid-range PA 444, and high-range PA 446, are operational. It should be noted that any number of power amplifiers may be utilized in a similar arrangement, and the scope of the claimed subject matter is not limited in this respect.

Referring now to FIG. 5, a block diagram of an information-handling system capable of utilizing a digital integrated transmitter using subranging for pulse-position and pulse-width modulation in accordance with one or more embodiments. Information-handling system 500 of FIG. 5 may tangibly embody one or more of any of the network elements of network 100 as shown in and described with respect to FIG. 1. For example, information-handling system 500 may represent the hardware of base station 114 and/or subscriber station 116, with greater or fewer components depending on the hardware specifications of the particular device or network element. Although information-handling system 500 represents one example of several types of computing platforms, information-handling system 500 may include more or fewer elements and/or different arrangements of elements than shown in FIG. 5, and the scope of the claimed subject matter is not limited in these respects.

Information-handling system 500 may comprise one or more processors such as processor 510 and/or processor 512, which may comprise one or more processing cores. One or more of processor 510 and/or processor 512 may couple to one or more memories 516 and/or 518 via memory bridge 514, which may be disposed external to processors 510 and/or 512, or alternatively at least partially disposed within one or more of processors 510 and/or 512. Memory 516 and/or memory 518 may comprise various types of semiconductor based memory, for example, volatile-type memory and/or non-volatile-type memory. Memory bridge 514 may couple to a graphics system 520 to drive a display device (not shown) coupled to information-handling system 500.

Information-handling system 500 may further comprise input/output (I/O) bridge 522 to couple to various types of I/O systems. I/O system 524 may comprise, for example, a universal serial bus (USB) type system, an IEEE 1394 type system, or the like, to couple one or more peripheral devices to information-handling system 500. Bus system 526 may comprise one or more bus systems, such as a peripheral component interconnect (PCI) express type bus or the like, to connect one or more peripheral devices to information-handling system 500. A hard disk drive (HDD) controller system 528 may couple one or more hard disk drives or the like to information-handling system, for example, Serial ATA type drives or the like, or alternatively a semiconductor-based drive comprising flash memory, phase change, and/or chalcogenide-type memory or the like. Switch 530 may be utilized to couple one or more switched devices to I/O bridge 522, for example Gigabit Ethernet type devices or the like. Furthermore, as shown in FIG. 5, information-handling system 500 may include a radio-frequency (RF) block 532 comprising RF circuits and devices for wireless communication with other wireless communication devices and/or via wireless networks, such as network 100 of FIG. 1, for example, in which information-handling system 500 embodies base station 114 and/or subscriber station 116, although the scope of the claimed subject matter is not limited in this respect. In one or more embodiments, RF block 532 may comprise transmitter 200 of FIG. 2, transmitter 300 of FIG. 3, and/or transmitter 400 of FIG. 4, at least in part. Furthermore, at least some portion of transmitters 200, 300, and/or 400 may be implemented by processor 510, for example, the digital functions of transmitters 200, 300, and/or 400, which may include for example processing of the baseband and/or quadrature signals, although the scope of the claimed subject matter is not limited in this respect.

Referring now to FIG. 6, a block diagram of a wireless local area or cellular network communication system showing one or more network devices utilizing a digital integrated transmitter using subranging for pulse-position and pulse-width modulation in accordance with one or more embodiments will be discussed. In the communication system 600 shown in FIG. 6, a mobile unit 610 may include a wireless transceiver 612 to couple to an antenna 618 and to a processor 614 to provide baseband and media access control (MAC) processing functions. In one or more embodiments, mobile unit 610 may be a cellular telephone or an information-handling system, such as a mobile personal computer or a personal digital assistant or the like that incorporates a cellular telephone communication module, although the scope of the claimed subject matter is not limited in this respect. Processor 614 in one embodiment may comprise a single processor, or alternatively may comprise a baseband processor and an applications processor, although the scope of the claimed subject matter is not limited in this respect. Processor 614 may couple to a memory 616 which may include volatile memory, such as dynamic random-access memory (DRAM), non-volatile memory, such as flash memory, or alternatively may include other types of storage, such as a hard disk drive, although the scope of the claimed subject matter is not limited in this respect. Some portion or all of memory 616 may be included on the same integrated circuit as processor 614, or alternatively some portion or all of memory 616 may be disposed on an integrated circuit or other medium, for example, a hard disk drive, that is external to the integrated circuit of processor 614, although the scope of the claimed subject matter is not limited in this respect.

Mobile unit 610 may communicate with access point 622 via wireless communication link 632, in which access point 622 may include at least one antenna 620, transceiver 624, processor 626, and memory 628. In one embodiment, access point 622 may be a base station of a cellular telephone network, and in an alternative embodiment, access point 622 may be an access point or wireless router of a wireless local or personal area network, although the scope of the claimed subject matter is not limited in this respect. In an alternative embodiment, access point 622 and optionally mobile unit 610 may include two or more antennas, for example, to provide a spatial division multiple access (SDMA) system or a multiple input, multiple output (MIMO) system, although the scope of the claimed subject matter is not limited in this respect. Access point 622 may couple with network 630 so that mobile unit 610 may communicate with network 630, including devices coupled to network 630, by communicating with access point 622 via wireless communication link 632. Network 630 may include a public network, such as a telephone network or the Internet, or alternatively network 630 may include a private network, such as an intranet, or a combination of a public and a private network, although the scope of the claimed subject matter is not limited in this respect. Communication between mobile unit 610 and access point 622 may be implemented via a wireless local area network (WLAN), for example a network compliant with a an Institute of Electrical and Electronics Engineers (IEEE) standard such as IEEE 802.11a, IEEE 802.11b, HiperLAN-II, and so on, although the scope of the claimed subject matter is not limited in this respect. In another embodiment, communication between mobile unit 610 and access point 622 may be at least partially implemented via a cellular communication network compliant with a Third Generation Partnership Project (3GPP or 3G) standard, although the scope of the claimed subject matter is not limited in this respect. In one or more embodiments, antenna 618 may be utilized in a wireless sensor network or a mesh network, although the scope of the claimed subject matter is not limited in this respect.

Referring now to FIG. 7, a flow diagram of a method for using subranging for a position and pulse-width modulation based transmitter in accordance with one or more embodiments will be discussed. Although FIG. 7 shows one particular order of the blocks of method 700, method 700 is not limited to any particular order of the blocks, and may further include more or fewer blocks than shown in FIG. 7. Furthermore, method 700 may be directed to any number of numbers of paths for phase modulation and/or for any number of power amplifiers, and the scope of the clamed subject matter is not limited in these respects.

In one or more embodiments, a local-oscillator (LO) signal may be generated at block 710. The LO signal may be phase modulated at block 712 with two or more phase-modulation signals on two or more phase-modulation paths. The resulting phase-modulated signals may be pulse-width modulated at block 714 to provide two or more pulse-position and pulse-width modulation ($P^3WM$) signals. The two or more $P^3WM$ signals may be added at block 716 using a digital logic adder, for example, to provide a sum signal and a carry signal as an output of the adder. A first $P^3WM$ signal may then be amplified at block 718 with a first power amplifier. In one or more embodiments, such a first power amplifier may be a main power amplifier that operates while the transmitter is transmitting a signal. In one or more embodiments, the first power amplifier may amplify the sum signal provided by the digital logic adder. One or more additional $P^3WM$ signals may be amplified at block 720 with one or more additional power amplifiers. In one more embodiments, such one or more additional power amplifiers may be an overload power amplifier that operates based on the power of the signal to be transmitted, for example, at or near peak power. In one or more embodiments, the one or more additional power amplifiers may amplify the carry signal provided by the digital logic adder. The outputs of the amplifiers may be summed at block 722, and the summed outputs may be transmitted as an OFDM signal at block 724. It should be noted that method 700 of FIG. 7 may be applied to a transmitter having any number of modulation paths and/or power amplifiers, and the scope of the claimed subject matter is not limited in these respects.

Referring now to FIG. 8, FIG. 9, and FIG. 10, in one or more embodiments, transmitter 200 of FIG. 2 may implement various subranging techniques. Subranging divides the required dynamic range over two or more power amplifiers 224 by generalizing the concept of the signal decomposition. Such an arrangement allows for a wide power dynamic range while keeping each power amplifier 200 in its optimal range of pulse widths for efficiency. Three example embodiments of such subranging techniques are discussed herein, below which comprise a pulse-width-position envelope-elimination-and-restoration (PWPM-EER) scheme, an alternative embodiment of a pulse-width-position envelope-elimination-and-restoration (PWPM-EER), and a PWPM-outphasing scheme. Various PWPM-Doherty schemes are shown in and described with respect to FIG. 2, FIG. 3 and FIG. 4. One or more embodiments of a PWPM-EER scheme and a PWPM-outphasing scheme are shown in and described with respect to FIG. 8, FIG. 9, and FIG. 10, below.

Referring now to FIG. 8, transmitter 800 implementing a PWPM-EER scheme is illustrated. Coordinate Rotation Digital Computer (CORDIC) block 810 first decomposes a desired OFDM signal into its polar components $\rho(t)$ and $\phi(t)$. The amplitude is then mapped into the outphasing angle $\theta(t)$. Note that $\phi(t)$ is already available from the initial processing stage. Between the two stages, the dynamic range of the amplitude is partitioned into two paths, $\rho_1(t)$ and $\rho_2(t)$ using the following equations:

$$\rho_1(t) = \begin{cases} \rho(t); & \rho(t) > \rho_{th} \\ \rho_{th}; & \rho(t) \le \rho_{th} \end{cases}$$

$$\rho_2(t) = \begin{cases} 1; & \rho(t) > \rho_{th} \\ \dfrac{\rho(t)}{\rho_{th}}; & \rho(t) \le \rho_{th} \end{cases}$$

In one or more embodiments, the first path may be clipped on the low side, however, the use of any PAPR limiting algorithms for the top-end of the dynamic range are not limited in this respect. Furthermore, any required pre-distortion may be introduced at this stage. The first path, $\rho_1(t)$ is mapped into the outphasing angle $\theta(t)$ using the same equations as before. The second path can be used to control a supply regulator which can either be a switching regulator, for example, for higher efficiency, or a linear regulator, for example, for lower noise, or any combination thereof to achieve both objectives.

Referring now to FIG. 10, transmitter 1000 implementing a PWPM-Outphasing scheme with outphasing is illustrated. As shown in FIG. 10, the same signal decomposition approach as used above in FIG. 8 is implemented, mapping the OFDM signal into its polar components and splitting the dynamic range of the amplitude. The top end of the dynamic range $\rho_1(t)$ is mapped into an outphasing angle $\theta_1(t)$ while the bottom end is mapped into an equivalent outphasing angle $\theta_2(t)$. The signal $\theta_1(t)$ is used to phase modulate the LO signal from high-frequency source 1010 to be combined as part of a regular P³WM scheme using phase modulators 1012. The power dynamic range of the resulting P³WM signal is limited to the level specified by the threshold used in the splitting. The output of the P³WM combiner (PWM LOGIC) 1014 is used to drive two phase modulators 1016 controlled by $\theta_2(t)$ which introduce a phase shift between the two switching power amplifiers 224. Thus, the two P³WM power amplifiers 224 are driven by simple phase shifted, or delayed, versions of the same common P³WM input as shown in FIG. 10. When the outputs of the two power amplifiers 224 are combined, the outphasing arrangement restores the bottom end of the dynamic range. Although such an outphasing arrangement of FIG. 10 shows two P³WM branches, such an outphasing arrangement can be extended to an arbitrary number of branches while limiting the dynamic range appropriately, and the scope of the claimed subject matter is not limited in this respect.

Referring now to FIG. 9, transmitter 900 implementing an alternative embodiment of a PWPM-EER scheme is illustrated. As shown in FIG. 9, transmitter 900 utilizes a second path to control the number of fingers in the power amplifier 224. In such an arrangement, the gain of power amplifier 224 may be adjusted by varying the device width. The drivers for unused fingers may be shut to further improve the PAE for such a scheme, although the scope of the claimed subject matter is not limited in this respect.

While several example outphasing schemes are discussed herein, other outphasing schemes may likewise be implemented, and the scope of the claimed subject matter is not limited in this respect. Other circuits may be utilized to adjust the output power of one or more power amplifiers 224, for example load modulation and so on, can be combined with a P³WM drive to maintain suitable efficiency at back-off power. Furthermore, any one or more of such outphasing schemes can be combined to further segment the power dynamic range, and the scope of the claimed subject matter is not limited in this respect. In one or more embodiments, such outphasing schemes enable the use of switching power amplifiers for achieving higher efficiency across a wider power variation while maintaining a sufficient modulation quality suitable for wideband modulation signals exhibiting significant envelope variation. Such outphasing embodiments utilize the phase-domain decomposition of the complex modulation signal. In contrast to voltages and currents, finer time and/or phase resolution is achievable on-chip in deeply scaled CMOS, wherein such resolution is capable of improving with process scaling. In one or more embodiments, the phase separated signals may be generated to drive multiple power amplifiers using simple digital logic in one or more embodiments. Furthermore, such outphasing schemes are amenable for integration in a digital transmitter architecture on a scaled CMOS process. In one or more embodiments, out-of-band emission of the transmitter at harmonic frequencies may be reduced by limiting the minimum pulse widths as the energy wasted at odd harmonics is reduced in a manner that analogous to the utilization of a multibit power amplifier in that that the output more closely approximates the input waveform, although the scope of the claimed subject matter is not limited in this respect. In one or more embodiments, the power handling capacity of one or more of the power amplifiers is 1/n of the equivalent when an n-phase separation signal is generated to drive n-number of power amplifiers, which may allow integration of the power amplifiers on CMOS, although the scope of the claimed subject matter is not limited in these respects.

Although the claimed subject matter has been described with a certain degree of particularity, it should be recognized that elements thereof may be altered by persons skilled in the art without departing from the spirit and/or scope of claimed subject matter. It is believed that the subject matter pertaining to subranging for a pulse position and pulse width modulation based transmitter and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method, comprising:
   generating a local oscillator signal;
   modulating the local oscillator signal with two or more phase modulation signals on two or more modulation paths to provide two or more phase-modulated signals;
   pulse-width modulating the phase-modulated signals to provide one or more pulse-position and pulse-width modulated signals;
   amplifying the one or more pulse-position and pulse-width modulated signals with one or more power amplifiers, the amplifying comprising amplifying a first pulse-position and pulse-width modulated signal more frequently than amplifying a second pulse-position and pulse-width modulated signal; and
   providing an output signal to be transmitted.

2. A method as claimed in claim 1, wherein said amplifying the second pulse-position and pulse-width modulated signal occurs if the output signal to be transmitted has a power greater than a predetermined threshold, or otherwise does not occur.

3. A method as claimed in claim 1, wherein said amplifying the second pulse-position and pulse-width modulated signal occurs at or near peak power, or otherwise does not occur.

4. A method as claimed in claim 1, wherein at least one or more of the pulse-position and pulse-width modulated signals has a constant, or nearly constant, amplitude when non-zero valued.

5. A method as claimed in claim 1, wherein the output signal to be transmitted comprises a signal modulated via one or more of the following modulation schemes: orthogonal frequency division multiplexing (OFDM), continuous wave (CW) modulation, amplitude-shift keying (ASK) modulation, phase-shift keying (PSK) modulation, frequency-shift keying (FSK) modulation, quadrature amplitude modulation (QAM), continuous phase modulation (CPM), trellis code modulation (TCM), or combinations thereof.

6. A method as claimed in claim 1, further comprising adding two or more pulse-position and pulse-width modulated signals prior to said amplifying the two or more pulse-position and pulse-width modulated signals to drive a first power amplifier and a second power amplifier.

7. A method as claimed in claim 1, further comprising adding two or more pulse-position and pulse-width modulated signal prior to said amplifying the two or more pulse-position and pulse-width modulated signals to drive a first power amplifier with a sum signal resulting from said adding, and to drive a second power amplifier with a carry signal resulting from said adding.

8. A method as claimed in claim 1, further comprising adding two or more pulse-position and pulse-width modulated signal prior to said amplifying the two or more pulse-position and pulse-width modulated signals, to drive a first power amplifier, a second power amplifier, or a third power amplifier, or combinations thereof.

9. A method as claimed in claim 1, further comprising adding two or more pulse-position and pulse-width modulated signal prior to said amplifying the two or more pulse-position and pulse-width modulated signals, to drive a first power amplifier, a second power amplifier, or a third power amplifier, or combinations thereof, the first power amplifier operating if the signal to be transmitted has a lower power range, the first and second power amplifier operating if signal to be transmitted has a mid power range, and the first, second, and third power amplifier operating if the signal to be transmitted has a higher power range.

10. An apparatus, comprising:
    a frequency synthesizer to generate a local oscillator signal;
    two or more phase modulators to modulate the local oscillator signal with two or more phase-modulation signals on two or more modulation paths to provide two or more phase-modulated signals;
    two or more pulse-width modulation combiners to combine the two or more phase-modulated signals to provide one or pulse-position and pulse-width modulated signals; and
    one or more power amplifiers to amplify the pulse-position and pulse-width modulated signals, at least a first amplifier being capable of amplifying a first pulse-position and pulse-width modulated signal more frequently than a second amplifier amplifies a second pulse-position and pulse-width modulated signal.

11. An apparatus as claimed in claim 10, wherein the second amplifier is capable of amplifying the second pulse-position and pulse-width modulated signal if the output signal to be transmitted has a power greater than a predetermined threshold, and otherwise does not occur.

12. An apparatus as claimed in claim 10, wherein the second amplifier is capable of amplifying the second pulse-position and pulse-width modulated signal at or near peak power, and otherwise does not amplify the second pulse-position and pulse-width modulated signal.

13. An apparatus as claimed in claim 10, wherein at least one or more of the pulse-position and pulse-width modulated signals has a constant, or nearly constant, amplitude.

14. An apparatus as claimed in claim 10, wherein the output signal to be transmitted comprises a signal modulated via one or more of the following modulation schemes: orthogonal frequency division multiplexing (OFDM), continuous wave (CW) modulation, amplitude-shift keying (ASK) modulation, phase-shift keying (PSK) modulation, frequency-shift keying (FSK) modulation, quadrature amplitude modulation (QAM), continuous phase modulation (CPM), trellis code modulation (TCM), or combinations thereof.

15. An apparatus as claimed in claim 10, further comprising an adder capable of adding two or more pulse-position and pulse-width modulated signals to drive a first one of the power amplifiers and a second one of the power amplifiers.

16. An apparatus as claimed in claim 10, further comprising an adder capable of adding two or more pulse-position and pulse-width modulated signals to drive a first one of the power amplifiers with a sum signal resulting from said adding, and to drive a second one of the power amplifiers with a carry signal resulting from said adding.

17. An apparatus as claimed in claim 10, further comprising an adder capable of adding two or more pulse-position and pulse-width modulated signals to drive a first one of the power amplifiers, a second one of the power amplifiers, or a third one of the power amplifiers, or combinations thereof.

18. An apparatus as claimed in claim 10, further comprising an adder capable of adding two or more pulse-position and pulse-width modulated signals to drive a first one of the power amplifiers, a second one of the power amplifiers, or a third one of the power amplifiers, or combinations thereof, the first power amplifier operating if the signal to be transmitted has a lower power range, the first and second power amplifier operating if signal to be transmitted has a mid power range, and the first, second, and third power amplifier operating if the signal to be transmitted has a higher power range.

19. An apparatus, comprising:
a baseband processor;
a transceiver coupled to the baseband processor; and
an antenna coupled to the transceiver;
wherein the transceiver comprises:
a frequency synthesizer to generate a local oscillator signal;
two or more phase modulators to modulate the local oscillator signal with two or more phase-modulation signals on two or more modulation paths to provide two or more phase-modulated signals;
two or more pulse-width modulation combiners to combine the two or more phase-modulation signals to provide one or more pulse-position and pulse-width modulated signals; and
one or more power amplifiers to amplify the pulse position and pulse width modulated signals, a first amplifier being capable of amplifying a first pulse-position and pulse-width modulated signal more frequently than a second amplifier amplifies a second pulse-position and pulse-width modulated signal.

20. An apparatus as claimed in claim 19, wherein the second amplifier is capable of amplifying the second pulse-position and pulse-width modulated signal if the output signal to be transmitted has a power greater than a predetermined threshold, and otherwise does not occur.

21. An apparatus as claimed in claim 19, wherein the second amplifier is capable of amplifying the second pulse-position and pulse-width modulated signal at or near peak power, and otherwise does not amplify the second pulse position and pulse width modulated signal.

22. An apparatus as claimed in claim 19, wherein at least one or more of the pulse-position and pulse-width modulated signals has a constant, or nearly constant, amplitude.

23. An apparatus as claimed in claim 19, wherein the output signal to be transmitted comprises a signal modulated via one or more of the following modulation schemes: orthogonal frequency division multiplexing (OFDM), continuous wave (CW) modulation, amplitude-shift keying (ASK) modulation, phase-shift keying (PSK) modulation, frequency-shift keying (FSK) modulation, quadrature amplitude modulation (QAM), continuous phase modulation (CPM), trellis code modulation (TCM), or combinations thereof.

24. An apparatus as claimed in claim 19, further comprising an adder capable of adding two or more pulse-position and pulse-width modulated signals to drive a first one of the power amplifiers and a second one of the power amplifiers.

25. An apparatus as claimed in claim 19, further comprising an adder capable of adding two or more pulse-position and pulse-width modulated signals to drive a first one of the power amplifiers with a sum signal resulting from said adding, and to drive a second one of the power amplifiers with a carry signal resulting from said adding.

26. An apparatus as claimed in claim 19, further comprising an adder capable of adding two or more pulse-position and pulse-width modulated signals to drive a first one of the power amplifiers, a second one of the power amplifiers, or a third one of the power amplifiers, or combinations thereof.

27. An apparatus as claimed in claim 19, further comprising an adder capable of adding two or more pulse-position and pulse-width modulated signals to drive a first one of the power amplifiers, a second one of the power amplifiers, or a third one of the power amplifiers, or combinations thereof, the first power amplifier operating if the signal to be transmitted has a lower power range, the first and second power amplifier operating if signal to be transmitted has a mid power range, and the first, second, and third power amplifier operating if the signal to be transmitted has a higher power range.

* * * * *